(12) United States Patent
Ochiai et al.

(10) Patent No.: US 7,514,197 B2
(45) Date of Patent: Apr. 7, 2009

(54) RESIST AND METHOD OF FORMING RESIST PATTERN

(75) Inventors: Yukinori Ochiai, Tokyo (JP); Masahiko Ishida, Tokyo (JP); Junichi Fujita, Tokyo (JP); Takashi Ogura, Tokyo (JP); Junji Momoda, Yamaguchi (JP); Eiji Oshima, Fukuoka (JP)

(73) Assignees: NEC Corporation, Tokyo (JP); Tokuyama Corporation, Shunan-shi (JP)

( * ) Notice: Subject to any disclaimer, the term of this patent is extended or adjusted under 35 U.S.C. 154(b) by 283 days.

(21) Appl. No.: 10/527,068

(22) PCT Filed: Sep. 4, 2003

(86) PCT No.: PCT/JP03/11284

§ 371 (c)(1),
(2), (4) Date: Jan. 4, 2006

(87) PCT Pub. No.: WO2004/022513

PCT Pub. Date: Mar. 18, 2004

(65) Prior Publication Data

US 2006/0127798 A1    Jun. 15, 2006

(30) Foreign Application Priority Data

Sep. 9, 2002    (JP) ............................ 2002-262314

(51) Int. Cl.
G03C 1/73    (2006.01)
G03F 7/20    (2006.01)
G03F 7/30    (2006.01)
G03F 7/32    (2006.01)
G03F 7/36    (2006.01)

(52) U.S. Cl. .................... 430/270.1; 430/325; 430/326; 430/966; 430/942; 430/313; 430/331; 430/907

(58) Field of Classification Search ....................... None
See application file for complete search history.

(56) References Cited

U.S. PATENT DOCUMENTS 5,143,784 A  *  9/1992  Mita ........................... 428/336

(Continued)

FOREIGN PATENT DOCUMENTS

JP    4-15232    *    1/1992

(Continued)

OTHER PUBLICATIONS

English abstract for JP 4-15232, provided by JPO.*

(Continued)

*Primary Examiner*—Sin J. Lee
(74) *Attorney, Agent, or Firm*—Dickstein, Shapiro, LLP.

(57) ABSTRACT

The resist according to the present invention includes any one of tetrachloromethyl tetramethoxycalix [4] arene and trichloromethyl tetramethoxycalix [4] arene. The resist including such kind of components is soluble in the solvent having less effect to worsen a working environment, namely, ethyl lactate (EL), propylene glycol monomethyl ether (PGME), propylene glycol monomethyl ether acetate (PGMEA), ethyl propionate, n-butyl acetate and 2-heptanone. It can be developed by tetra-methyl ammonium hydroxide in addition to the above mentioned solvent. By exposing this resist by electronic ray, high resolution of 8 nm is attained, and by using this resist as a mask, various materials can be formed into a hyperfine shape. According to such kind of resist, a photosensitive resist material which has high resolution and solvable to solvents having less effect to worsen the working environment and can be developed by the solvents, a exposure method using it, and a hyperfine processing method using it are provided.

9 Claims, 4 Drawing Sheets

U.S. PATENT DOCUMENTS 5,702,620 A 12/1997 Ohnishi et al.

FOREIGN PATENT DOCUMENTS

| JP | 06-53819 | 7/1994 |
| JP | 07-23340 | 3/1995 |
| JP | 2792508 | 6/1998 |
| JP | 2000-330281 A | 11/2000 |
| JP | 2001-281864 A | 10/2001 |
| JP | 2002-049153 A | 2/2002 |
| JP | 2003-192649 A | 7/2003 |

OTHER PUBLICATIONS

Takeshi Nagasaki, et al.; "Novel Conformational Isomerism of Water-Soluble Calix[4] arenes"; Tetrahedron; vol. 48(5); 1992; pp. 797-804.

Masahiko Ishida, et al.; "Sub-10-nm-Scale Lithography Using p-chloromethyl-methoxy-calix[4] arene Resist"; Jpn. J. Appl. Phys.; vol. 42; 2003; pp. 3913-3916.

\* cited by examiner

RESIST AND METHOD OF FORMING RESIST PATTERN

TECHNICAL FIELD

The present invention relates to a resist used for pattern formation and etching to form a hyperfine structure exemplified in a semiconductor device and a semiconductor integrated circuit. The present invention particularly relates to a resist for radioactive ray irradiation exposure.

BACKGROUND ART

A hyperfine pattern forming technique has been rapidly developed as a forming technique for a semiconductor device or semiconductor integrated circuit. With the hyperfine structure of the pattern, the higher performance of the individual semiconductor device, namely, the higher speed and the smaller electric power consumption have been attained. Moreover, the improvement of the integration degree of the device leads to the attainment of the semiconductor integrated circuit having a higher function. Presently, the semiconductor integrated circuits whose circuit dimension (width) is about 130 nm are mass-produced.

In the device used in the semiconductor integrated circuit, silicon is used for the substrate. The hyperfine structure limit of the dimension under which the foregoing device is operated is said to be about 5 nm. Conventionally, optical exposure has been used to form the semiconductor device or integrated circuit. Presently, the optical exposure that uses a krypton fluoride laser having a wavelength of 256 nm is used. In order to cope with the hyperfine structure of the pattern, the usage of the light having a shorter wavelength is required. As the light expected to be used for the optical exposure of a next generation, argon fluoride laser having a wavelength of 195 nm is exemplified. Moreover, as the light expected to be used for the optical exposure of a further next generation, a fluorine laser having a wavelength of 154 nm is exemplified. In further future, there is a possibility that an extreme ultraviolet exposure having a wavelength of 11 to 13.5 nm, an X-ray exposure having a wavelength of about 1 nm and the like are used.

On the other hand, since the development of the device itself needs to be started prior to the mass production, an electronic beam exposure technique having versatility is used, although its throughput is low. As the electronic beam exposure technique, a method that has a relatively high throughput and uses a mask is put to practical use and its resolution is about 50 nm. On the other hand, the electronic beam exposure that uses a thinly-throttled electronic beam is the exposure technique that jointly attains the practicability and super high resolution that enable the formation of any pattern, and the resolution of 50 nm or less is easily obtained, and this is used for the research of a quantum size effect and the trial production of a super hyperfine transistor. A diameter of the electronic beam is about 1 nm in a case of a thin type. However, the minimum pattern is determined by the resolution of the resist. In the resist that uses an organic molecule having a high practicability, it is about 10 nm in a positive type of poly-methyl methacrylate (PMMA).

Japanese Laid Open Patent Application (JP-A 2001-281864) and Japanese Laid Open Patent Application (JP-A 2002-49153) disclose a method that uses a poly-ethylene group as a basic skeleton as negative type and positive type resist compositions.

Japanese Laid Open Patent Application (JP-A-Heisei, 6-53819), Japanese Laid Open Patent Application (JP-A-Heisei, 7-23340) and Japanese Laid Open Patent Application (JP-A 2000-330281) propose a calixarene resist as the negative type resist having the resolution of about 10 nm.

Japanese Patent No. 2792508 indicates that the foregoing calixarene resist can be solved in solvent by acetylation. Also, this indicates that in this calixarene resist, the sensibility to radioactive ray becomes high by chlorination. Through this calixarene resist, the negative type resist is used to easily carry out the pattern formation at a 10 nm level.

([Tetra-Hedron] written by Nagasaki et al., Vol. 48, Page 797-804, 1992) indicates a synthesizing method of CMC4AOMe or CMC3AOMe that is resist material.

DISCLOSURE OF INVENTION

As mentioned above, the calixarene acts as the negative type resist, and it is useful as the super high resolution resist by which the resolution of about 10 nm is attained. However, the solvent having capability of dissolving this resist material is the organic solvent including chlorine, such as dichlorobenzene, monochlorobenzene and the like, and the organic solvent such as xylene and the like is used for the development. These solvents containing chlorine have a tendency that their usages are inhibited as ozone layer break substance and have a tendency that their usages are inhibited because it is not preferred from the viewpoint of a work environment.

The large quantity of solvent and developer are used in a pattern forming process, and they are volatile. Thus, the perfect recovery thereof is difficult, which does not allow the usage in the mass production site of the semiconductor integrated circuit or the like.

In this way, the conventional calixarene cannot be used in the mass production factory that consumes a large quantity of solvent and development solution, and the usage in the production of the semiconductor device is difficult. Moreover, in recent years, the expectation for nano-technologies is increased, and the request to the super hyperfine pattern of 10 nm or less is increased. Thus, the lack of the resolution of the conventional calixarene is indicated.

So, the technical object of the present invention is to provide a resist material that has a resolution higher than conventional calixarene, and has a relatively small problem with a work environment, and can be dissolved in a solvent having less effect to worsen a working environment, and can be developed by using a development solution containing the solvent, and an exposing method and a hyperfine structure processing method of using it.

In the present invention, in order to solve the above-mentioned problems, many calixarene derivatives are synthesized and considered. Consequently, it is found that a resist including at least one of: 5,11,17,23-tetrachloromethyl-25,26,27,28-tetramethoxycalix [4] arene (CMC4AOMe) represented by the structural formula (I) of the following chemical formula 1 and 5,11,17-trichloromethyl-25,26,27,28 -tetramethoxycalix [4] arene (CMC3AOMe) composite represented by the structural formula (II) of the following chemical formula 2 has potential to resolve the problem.

[Chemical Formula 1]

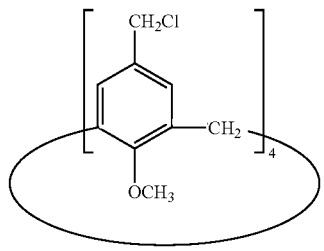

(I)

[Chemical Formula 2]

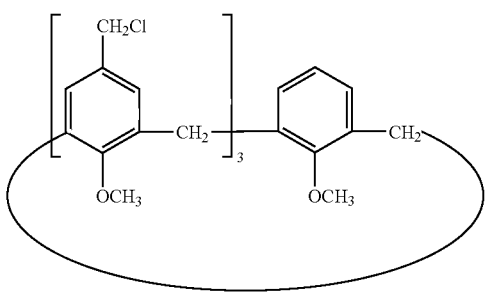

(II)

According to the present invention, a calixarene composition including at least one of: the 5,11,17,23-tetrachloromethyl-25,26,27,28-tetramethoxycalix [4] arene (CMC4AOMe) represented by the structural formula (I) of the foregoing chemical formula 1 and 5,11,17-trichloromethyl-25,26,27,28-tetramethoxycalix [4] arene (CMC3AOMe) represented by the structural formula (II) of the foregoing chemical formula 2 is provided.

Also, according to the present invention, a resist including at least one of: 5,11,17,23-tetrachloromethyl-25,26,27,28-tetramethoxycalix [4] arene (CMC4AOMe) represented by the structural formula (I) of the foregoing chemical formula 1 and 5,11,17-trichloromethyl-25,26,27,28-tetramethoxycalix [4] arene (CMC3AOMe) represented by the structural formula (II) of the foregoing chemical formula 2 is provided.

Also, according to the present invention, in addition to the above-mentioned resist, a resist further including at least one of: 5,11-dichloromethyl-25,26,27,28-tetramethoxycalix [4] arene (CMC2AOMe) represented by the structural formula (III) of the following chemical formula 3 and 5-monochloromethyl-25,26,27,28-tetramethoxycalix [4] arene (CMC1AOMe) represented by the structural formula (IV) of the following chemical formula 4 is provided.

[Chemical Formula 3]

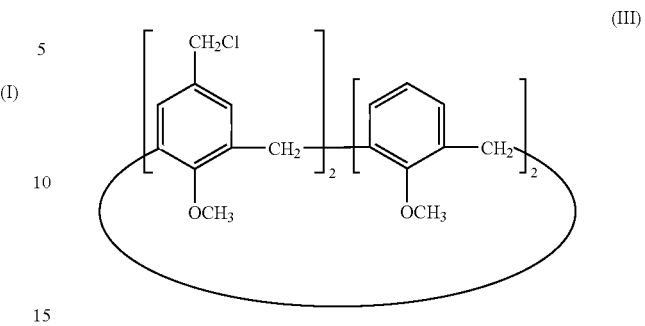

(III)

[Chemical Formula 4]

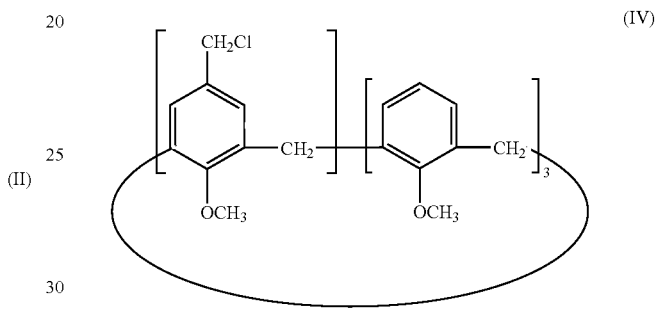

(IV)

Also, according to the present invention, in addition to any of the foregoing resists, resists further including at least one of oligomer and high molecule are provided.

Also, according to the present invention, in any one of the above-mentioned resists, the resist that is exposed by irradiating at least one of electronic beam, X-ray, ion beam and atom beam is provided.

Also, according to the present invention, in any one of the above-mentioned resists, the resist that uses the solvent having less effect to worsen a working environment as solvent is provided.

Also, according to the present invention, a method for forming a resist pattern including the steps of coating the above-mentioned resist, which uses the solvent excellent in the work environment property as the solvent, on substrate; exposing the resist coated on the substrate to the radioactive ray; and developing the resist.

The radioactive ray used for the exposure is at least one of a electronic beam, an X-ray, an ion beam and an atom beam.

Also, in the method according to the present invention, the solvent having less effect to worsen a working environment includes at least one of ethyl lactate (EL), propylene glycol monomethyl ether (PGME), propylene glycol mono-methyl ether acetate (PGMEA), ethyl propionate, n-butyl acetate 2-heptanone. The development solution includes at least one of ethyl lactate (EL), propylene glycol monomethyl ether (PGME), propylene glycol monomethyl ether acetate (PG-MEA), ethyl propionate, n-butyl acetate, 2-heptanone and tetramethyl ammonium hydroxide.

Also, according to the present invention, a method for processing a hyperfine pattern including the steps of forming a resist pattern by using any one of the above-mentioned resist pattern forming methods; and processing a substrate by using the foregoing resist pattern as a mask.

(Mode of the Operation of the Invention)

The calixarene represented by the structural formula (I) of the foregoing chemical formula 1 used in the resist of the present invention has 4 benzene rings in the molecule. On the contrary, 5,11,17,23,29,35-hexachloromethyl-37,38,39,40, 41,42-hexamethoxy calix [6] arene (CMC6AOMe) that is disclosed in Japanese Patent No.2792508 and represented by the structural formula (V) of the following chemical formula 5 has six benzene rings in the molecule and it is different from the present invention.

Also, in the case of CMC3AOMe that is used in the resist of the present invention and represented by the structural formula (II) of the chemical formula 2, chloromethyl group is coupled to three benzene rings among four benzene rings, the methoxy group is coupled to the four benzene rings, and the structure is different from CMC6AOMe.

[Chemical Formula 5]

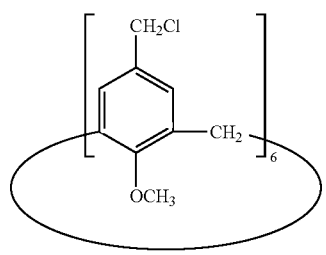

(V)

The calixarene compound used in the resist of the present invention is different in the action in many respects and useful in practical uses, as compared with CMC6AOMe.

At first, in the compound of the present invention, as compared with the conventional hexachloromethyl hexamethoxy calix [6] arene, the molecular weight is small. Thus, this has the higher resolution and the formation of the super hyperfine pattern is possible. This is the useful material in the entire nano-technologies, such as biochip and the like, as well as trial productions and manufacture of semiconductor devices. By using the material of the present invention as the resist and forming the pattern and then carrying out the etching process with this resist pattern as the mask, it is possible to process the ground material of the resist and perform the hyperfine processing on the ground material.

Moreover, the compound or composition of the present invention can be dissolved in the solvent having less effect to worsen a working environment [so-called safe solvent]. Concretely, they can be dissolved in the solvent whose usage can be allowed in the semiconductor mass production factory, such as ethyl lactate (EL), propylene glycol monomethyl ether (PGME), propylene glycol monomethyl ether acetate (PGMEA), ethyl propionate, n-butyl acetate, 2-heptanone and the like. These solvents also dissolve many resist materials typically put on the market. Then, the solution of resist using these solvents enables the thin uniform film to be formed through spin coating on the semiconductor substrate such as silicon and the like. Then, a hyperfine pattern can be formed by exposing and developing the formed film through the electronic beam and the like. A developer that can be used at this developing process includes xylene used as the development solution of CMC6AOMe, and solvents having less effect to worsen a working environment, such as ethyl lactate (EL), propylene glycol monomethyl ether (PGME), propylene glycol monomethyl ether acetate (PGMEA), ethyl propionate, n-butyl acetate, 2-heptanone. Moreover, it can be developed in tetramethyl ammonium hydroxide (TMAH) that is a typical developer used in semiconductor mass production sites.

Moreover, in a case of the resist of the present invention includes a composition which containing the mixture of CMC4OMe and CMC3OMe as a main component, the dissolubility of the resist to the solvent is improved, thereby a edge roughness property is improved and a sharp pattern can be obtained. The composition ratio between CMC4AOMe and CMC3AOMe is in a range between 99.5:0.5 and 0.5:99.5, preferably between 99:1 and 1:99, and further preferably in a range between 95:5 and 5:95. In the resist other than the mixture, different types of calixarene and polymers may be included as a component. Similarly in resists containing such component, the dissolubility is improved, and the edge roughness property is improved.

The composition including CMC4AOMe or CMC4AOMe and CMC3AOMe of the present invention has the useful property that it can be dissolved in the safe solvent and can be developed by in the safe solvent or tetramethyl ammonium hydroxide. Consequently, this is the practical resist material because the problem on the working environment is little and there is no problem even in mass production sites of silicon devices and the like which consume resists.

The radioactive ray resist of the present invention has the high resolution so that the pattern of 10 nm or less can be formed, and can provide the useful material for the nanotechnology such as making a hyperfine structure semiconductor devices and researching of the quantum effect and the producing of biochips and the like.

Also, the radioactive ray resist of the present invention can be dissolved in the solvent having less effect to worsen a working environment or having a small environmental load. Thus, in particular, this can be used in semiconductor mass production sites that consume a large quantity of resist, and the like.

BEST MODE FOR CARRING OUT THE INVENTION

Figure 1:
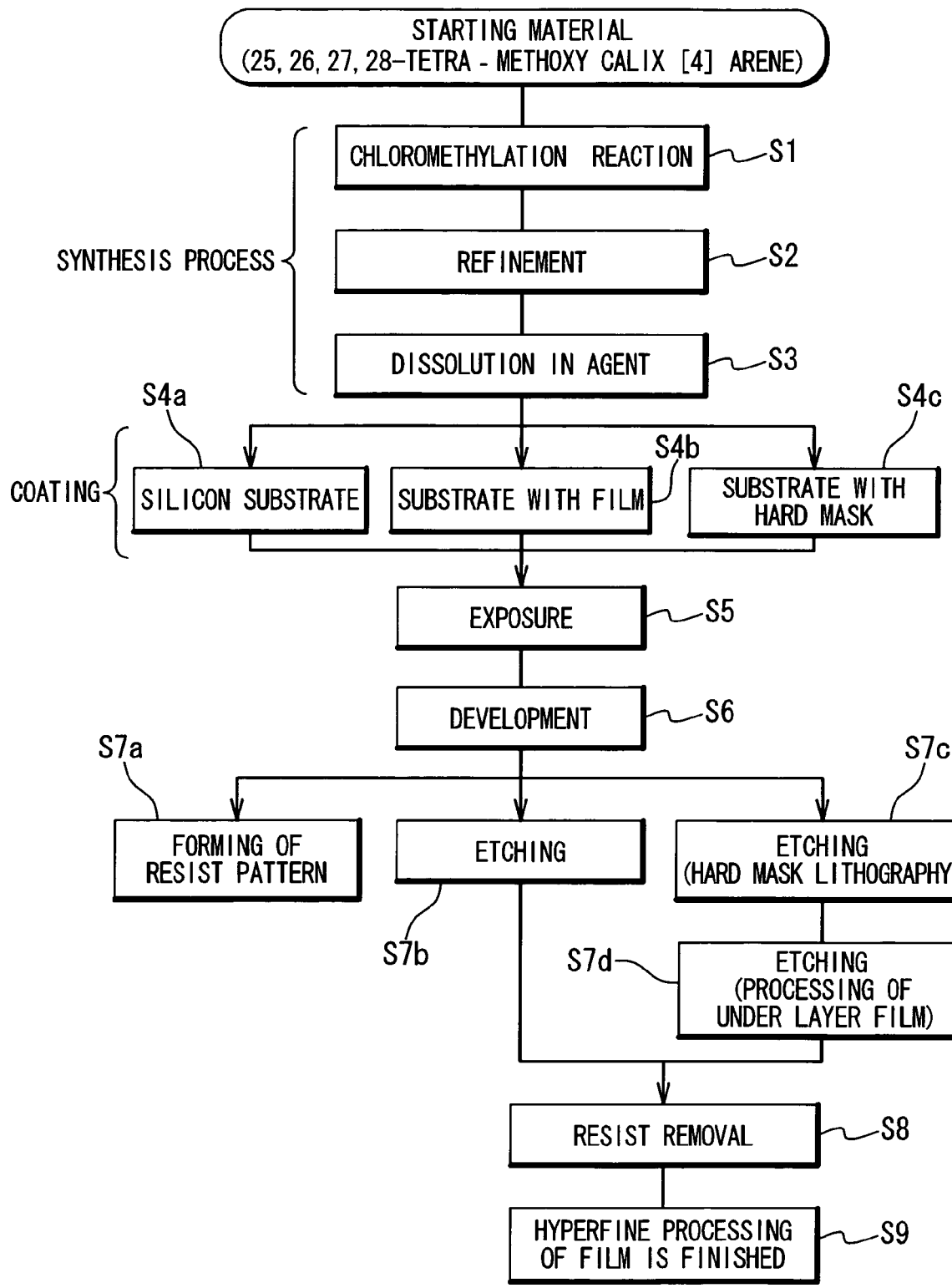
FIG. 1 is a flow chart showing a synthesizing method of a resist and a hyperfine pattern forming method according to an embodiment of the present invention.

The best mode for carrying out the present invention will be described below by referring to the drawings.

FIG. 1 is a flow chart showing the synthesizing method of a resist and the forming method of a hyperfine pattern according to an embodiment of the present invention. As shown in FIG. 1, CMC4AOMe or CMC3OMe that is the resist material is synthesized by using the method disclosed in the foregoing ([Tetra-Hedron] written by Nagasaki et al., Vol. 48, Page 797-804, 1992).

At first, 25,26,27,28-tetramethoxy calix [4] arene that is raw material is dissolved in dioxane of 50-time amount. Para formaldehyde of 40-mol times, acetic acid of 5-time amount and 85% phosphoric acid of 10-time amount are added, and heated and agitated for 8 hours at 100 celsius degree. After the reaction, the reaction solution is poured into water with ice, and deposited white solid is filtered and extracted.

As the synthesizing step, the foregoing solid is dissolved in chloroform, and water is added, and they are washed until a water phase becomes neutral. After a chloroform phase is dried with magnesium sulfate, it is concentrated to obtain the composition (Step S1). This composition is refined with silica gel column chromatography (developing solvent/ethyl acetate: hexane=1:7) (Step S2).

The derivative of the calixarene obtained by the purification is mixed at a proper mixture ratio as necessary and made into the composition. Also, oligomer (exemplified by: polystyrene of a low molecular weight) and polymer (exemplified by: PMMA, polystyrene of high molecular weight) are added and mixed. The amount of additives is possible in a range from 1 percent to 99 percent. Preferably, the amount of additives is a range from 1 percent to 50 percent.

Next, the material or composition obtained by the synthesis is dissolved in the solvent (Step S3).

Here, as the solvent can be used non-safe solvent such as monochloro benzene or dichloro benzene. However, since the property being dissoluble in the safe solvent is the feature of this material, it is preferable to use safe solvent such as ethyl lactate (EL), propylene glycol monomethyl ether (PGME), propylene glycol monomethyl ether acetate (PGMEA), ethyl propionate, n-butyl acetate, 2-heptanone and the like. In order to sufficiently dissolve, the agitation using a stylus and the like is effective. The solvent which can be used is not limited to the solvents explained here.

Next, as a coating step, the prepared solution is coated on a work such as a silicon substrate or the like by the spin coating method. As the material of the substrate, the silicon substrate (Step S4a), a substrate with a film (Step S4b) and a substrate with a hard mask (Step S4c) are exemplified. The film thickness to be coated is controlled on the basis of a rotation number. After the spin coating, because the solvent is vaporized, there may be a case of carrying out a heating step referred to as the pre-bake. As for the heating, for example, it is heated by an oven or a hot plate in nitrogen atmosphere at a temperature between about 80☐ and 170☐. The period is between about 1 minute and several hours. In this process condition, it is preferable to optimize according to employing processing method. The typical coating condition is such that when it is rotated at a rotation number of 3000 rpm between 30 seconds and 1 minute, a film thickness of about 30 nm is obtained after the pre-baking. This film thickness is desired to be properly changed, depending on the etching depth and the etching ratio between the processing target and the resist. As the substrate to be coated, the silicon substrate itself, and the silicon substrate with silicon oxide film, poly-silicon film or aluminum film are possible to use. Other than this, the work film can be selected according to need. Also, if the processing depth of non-processed film is deep or when the etching speed is not high, a middle film referred to as the hard mask is preliminarily formed on the work film. Once the pattern formed with the resist is transcribed into this middle film, the middle film having a high etching resistance is used as the mask, and the work under it can be efficiently etched and processed. As the hard mask, the films of silicon oxide film, silicon nitride film and the like are frequently used.

Next, after the coating, the resist film is exposed with the radioactive ray (Step S5). When the hyperfine pattern is formed, the electronic beam is used to expose in many cases. The electronic beam can thin a beam diameter to about several nm, and it is suitable for the formation of the super hyperfine pattern. Also, other than the electronic beam, the exposing can be carried out by using the ultraviolet ray, the X-ray, the extreme ultraviolet ray (EUV), the ion beam, the atomic beam and the like, which are used in the typical optical exposure.

Next, the exposed resist film is developed (Step S6). For the development, ethyl lactate (EL), propylene glycol monomethyl ether (PGME), propylene glycol monomethyl ether acetate (PGMEA), ethyl propionate, n-butyl acetate, 2-heptanone and the like, which are used as the solvent of the resist material, and tetramethyl ammonium hydroxide, xylene and the like are used. Basically, the solvent in which the dissolution speeds of the exposure portion and non-exposure portion are different is used as the developer. In the development, the exposed resist or sample is dipped in or brought into contact with the developer for about 30 seconds to several minutes. This resist is hard to dissolve in the developer as the radiated radioactive ray quantity is increased, and the pattern is formed. In this way, this resist acts as the negative type resist.

Figure 2:
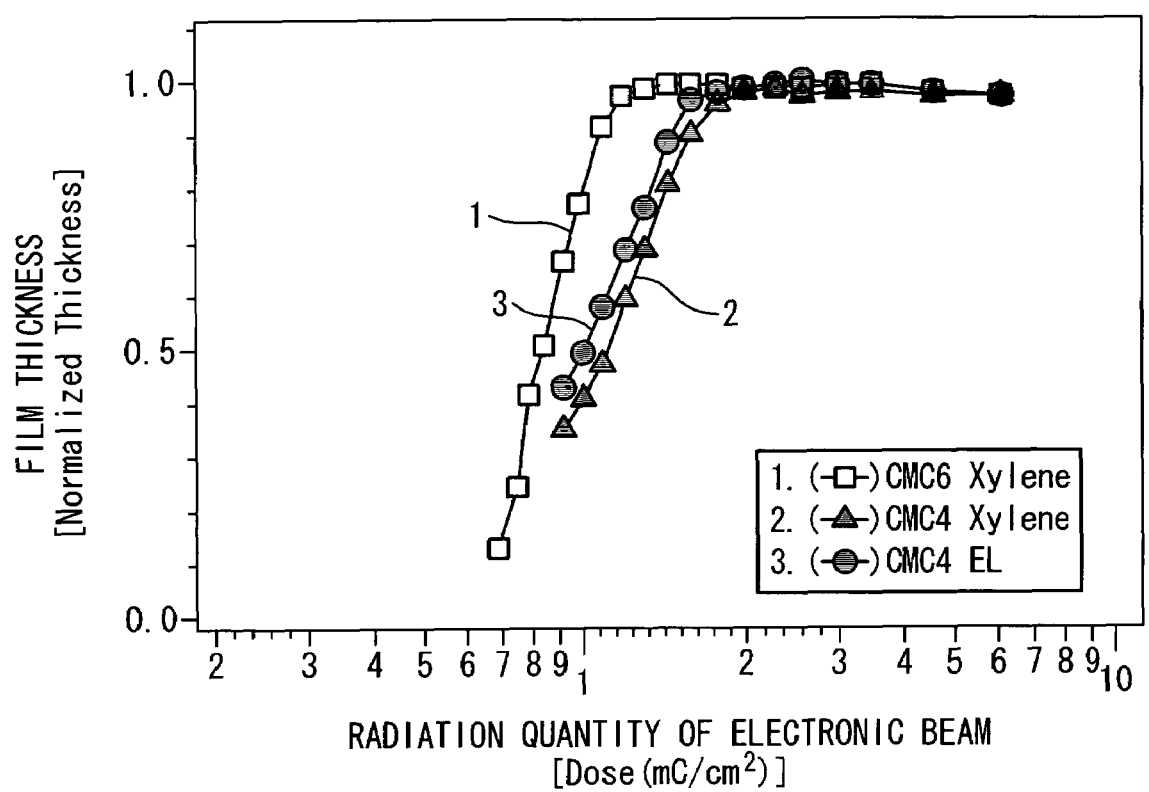
FIG. 2 is a view showing an example of an exposure property of the resist according to the embodiment of the present invention.

FIG. 2 is a view showing one example of the exposure property of the resist according to the embodiment of the present invention. The resist is the composition of 5,11,17,23-tetrachloromethyl-25,26,27,28-tetramethoxycalix [4] arene (CMC4AOMe)/5,11,17-trichloromethyl-25,26,27,28-tetramethoxy calix [4] arene (CMC3AOMe)=7/3. The composition is dissolved in ethyl lactate, and exposed through the Gaussian electronic beam, and developed with ethyl lactate or xylene. The lateral axis indicates the electronic beam irradiation quantity, and the longitudinal axis indicates the film thickness after the development.

FIG. 2 is showing the property of the mixture in which 5,11,17,23-tetrachloromethyl-25,26,27,28-tetramethoxycalix [4] arene (CMC4AOMe) in the structural formula (I) and the 5,11,17-trichloromethyl-25,26,27,28-tetramethoxy calix [4] arene (CMC3AOMe) are mixed at the rate of 7:3 in the molecular weight ratio is indicated therein. The irradiated electronic beam is the Gaussian beam type electronic beam of an acceleration voltage 50 kV. Ethyl lactate is used for the solvent, and the ethyl lactate and the xylene are used for the development. The property of CMC6AOMe is also indicated for the comparison. As the quantity of the electronic beam irradiation increases, the resist film remains without dissolving in the development solution after the development. In both of the ethyl lactate and the xylene, when the film is irradiated at the irradiation quantity of about 1 mC/cm$^2$, about half of the film thickness remains, and when the film is irradiated at the irradiation quantity of about 2 mC/cm$^2$, the film thickness at the time of the coating substantially remains. The exposure quantity at which the film thickness at the time of the coating remains is typically referred to as a resist sensibility. The ethyl lactate development is slightly higher in sensibility than the xylene development. It is known that CMC6AOMe for the comparison is further higher in the sensibility. The reason is considered such that because of the difference in the molecular weight, CMC4AOMe or the mixture of CMC4AOMe and CMC3AOMe requires more electronic beam irradiation in order to obtain the same polymerization degree of C6AOMe.

The sensibility of the resist shown in FIG. 2 is lower as compared with the sensibility of the resist typically put on the market. However, with the higher resolution, the sensibility tends to be lower. The sensibility of MC6AOAc that is not chlorinated is bad such as 10 mC/cm². This resist has the relatively high sensibility in spite of the high resolution.

Figure 3:
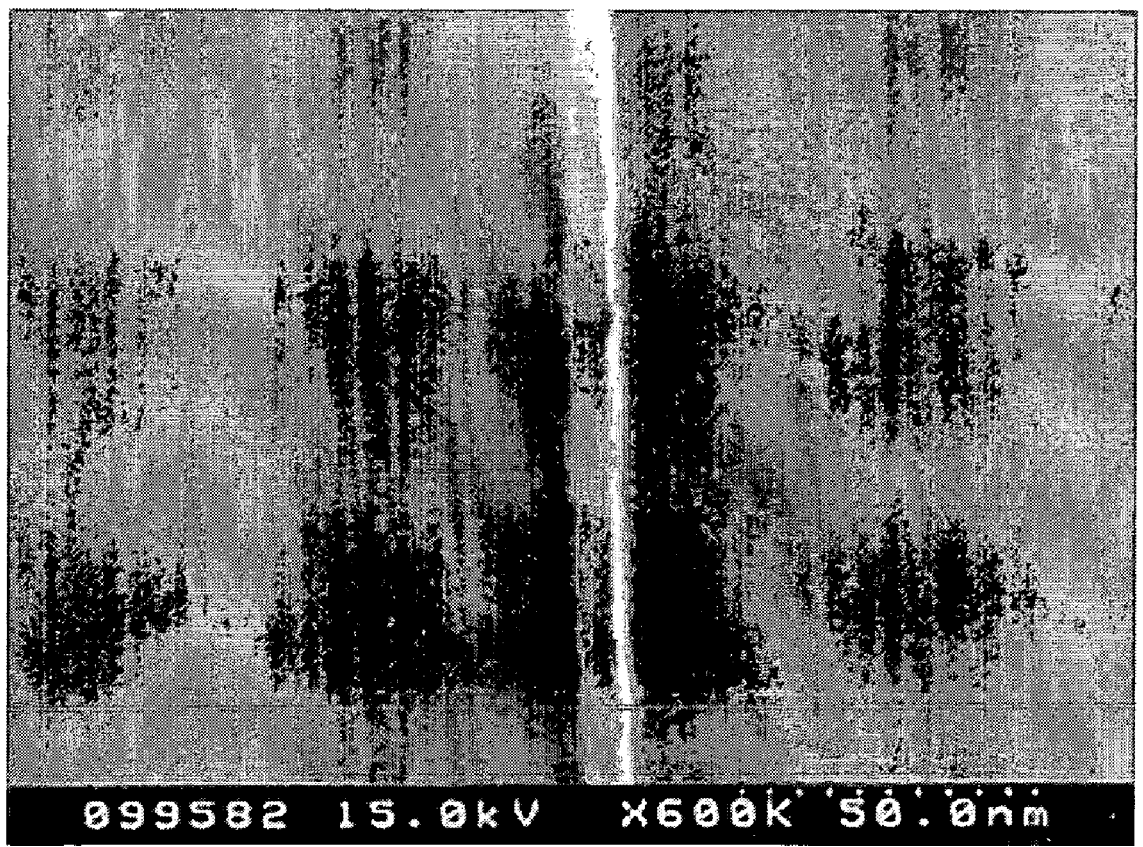
FIG. 3 is an electronic microscope picture indicating an example of a line pattern obtained by exposing and developing the resist according to the embodiment of the present invention through an electronic beam, in which silicon is used as a substrate and xylene is used as a developer.
Figure 4:
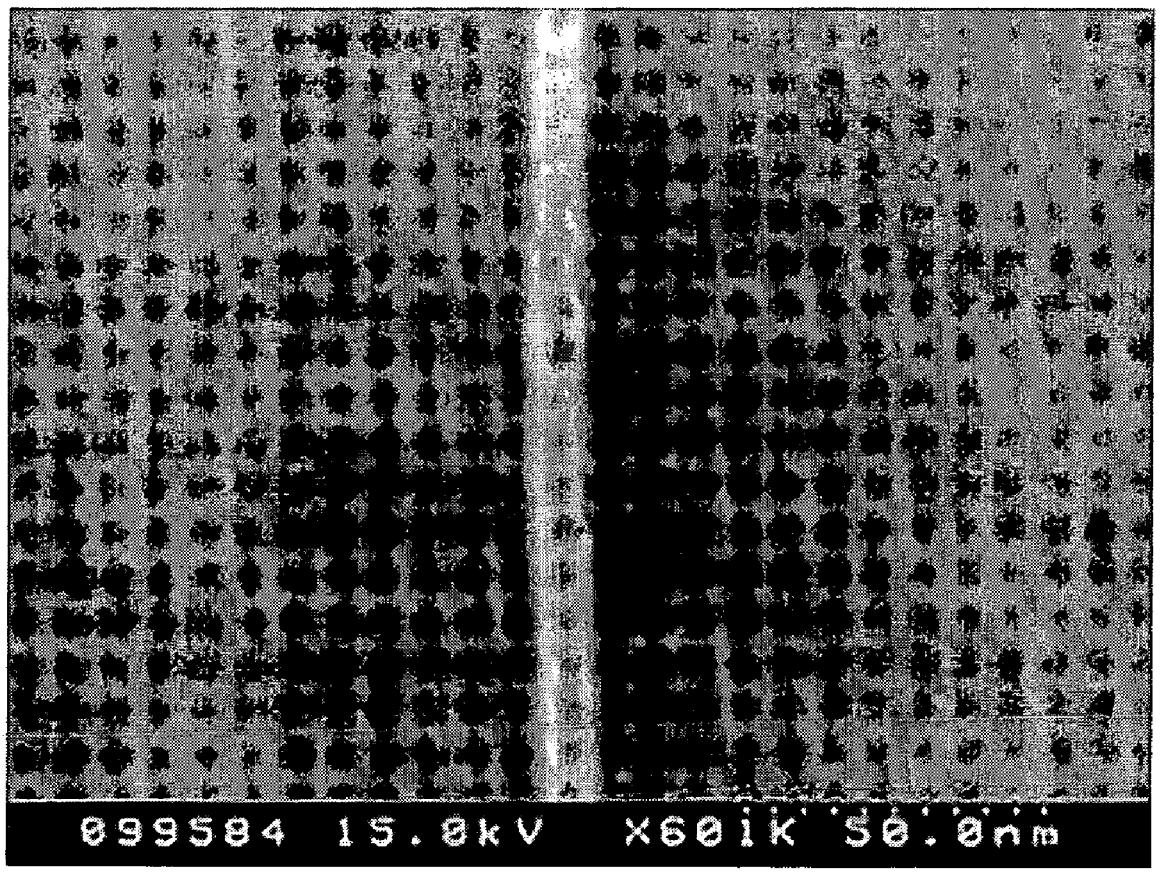
FIG. 4 is an electronic microscope picture indicating an example of a line pattern obtained by exposing the resist according to the embodiment of the present invention through the electronic beam and developing it, in which silison is used as a substrate, and ethyl lactate is used as a developer.

FIG. 3 and FIG. 4 are electronic microscope pictures indicating an example of the resist pattern after the development according to the embodiment of the present invention. In FIG. 3, development is carried out by using xylene, and in FIG. 4, development is carried out by using ethyl lactate, and in either figure, silicon is used as a substrate. In both cases, the line pattern was formed by exposition using the Gaussian beam to draw one line. In any of the examples, the line width is about 8 nm, which is very high resolution. The resist patterns shown in FIG. 3 and FIG. 4 are formed by using the resist containing the mixture of 5,11,17,23-tetrachloromethyl-25,26,27,28-tetramethoxycalix [4] arene (CMC4AOMe) in the structural formula (I) and 5,11,17-trichloromethyl-25,26,27,28-tetramethoxy calix [4] arene (CMC3AOMe) in the chemical formula 2 in which the mixed ratio of 7:3 in the molecular number ratio. The sensibility is high and the high resolution pattern in which the line width is 8 nm is obtained.

Also, as the resist composition, the composition in which any one or both of 5-monochloromethyl-25,26,27,28-tetramethoxycalix [4] arene indicated in the structural formula (IV) of the chemical formula 4 or chemical formula 2 and 5,11-dichloromethyl-25,26,27,28-tetramethoxycalix [4] arene are mixed with the compound of the foregoing structural formula (I) is allowable to use. Moreover, the oligomer (exemplified by: polystyrene of a low molecular weight) of a proper molecular weight other than calixarene and the organic high molecular compound (example: PMMA, polystyrene of high molecular weight) may be mixed. The amount of such additive is in a range from small amount of 0.01% to about 30%. The resist made of these composition can be dissolved in safe solvents and has the sensibility to the radioactive ray, and can be developed with the safe solvents, and enables the formation of the hyperfine pattern and can be used for the formation of the hyperfine shape.

As explained above, this resist is used to form the hyperfine resist pattern. After that, as necessary, with this resist pattern as the mask, the under layer is etched. As the etching method, the dry etching that uses the plasma and the ion, and the wet etching that uses the solution can be applied. In order to form the hyperfine shape at a good precision, the dry etching is generally used. For example, the sputtering that uses the argon ion or the milling is used to etch the work. In order to efficiently etch, the reactive ion etching is used, and it is used depending on the material of the work, and the ion, namely, the gas kind and the mixture ratio of the gas is changed. For example, fluorine-based gas or bromine-based gas is used to etch the silicon oxide film. Or, chlorine-based gas is used to etch the compound such as gallium arsenide and the like. Concretely, the gas such as $CF_4$, $CHF_3$, $CClF_2$, $BCl_3$, $CBrF_3$, $SF_6$ and the like, or the gas in which oxygen or argon gas is mixed with the foregoing gas is used. There are many foregoing gas kinds and combinations of those mixtures. Also, if the etching speed of the targeted work is not very faster or it is slower than the etching speed of the resist mask, the resist pattern is once transcribed into the middle film having the high etching resistance, and the under layer is processed with this middle film as the mask. In this case, when the resist pattern is transcribed into the middle film, the gas kind in which the etching speed ratio to the resist can be set is used.

When the under layer is etched with the middle film as the mask, the gas kind is changed, and the gas kind in which the etching speed ratio between the middle film and the ground can be set. Also, there are many kinds of the methods of generating the ion and the plasma, and any of them can be applied.

The invention claimed is:

1. A resist comprising at least one of 5,11,17,23-tetrachloromethyl-25,26,27,28-tetramethoxycalix [4] arene (CMC4AOMe) represented by the structural formula (I) of the following chemical formula 3 and 5,11,17-trichloromethyl-25,26,27,28-tetramethoxycalix [4] arene (CMC3AOMe) represented by the structural formula (II) of the following chemical formula 4; and at least one solvent selected from the group consisting of ethyl lactate (EL), propylene glycol monomethyl ether (PGME), propylene glycol monomethyl ether acetate (PGMEA), ethyl propionate, n-butyl acetate and 2-heptanone

[Chemical Formula 3]

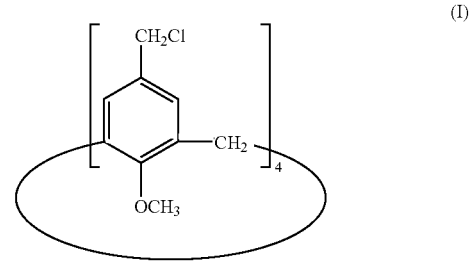

[Chemical Formula 4]

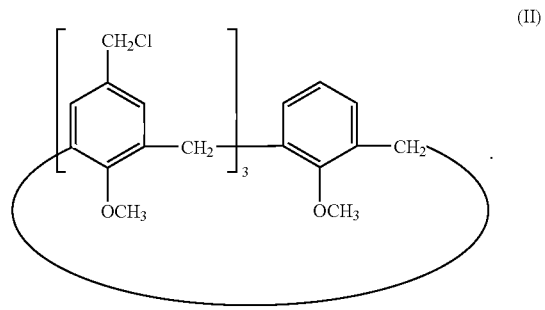

2. The resist according to claim 1, further comprising at least one of 5,11-dichloromethyl-25,26,27,28-tetramethoxycalix [4] arene (CMC2AOMe) represented by the structural formula (III) of the following chemical formula 5 and 5-monochloromethyl-25,26,27,28-tetramethoxycalix [4] arene (CMC1AOMe) represented by the structural formula (IV) of the following chemical formula 6 is provided

[Chemical Formula 5]

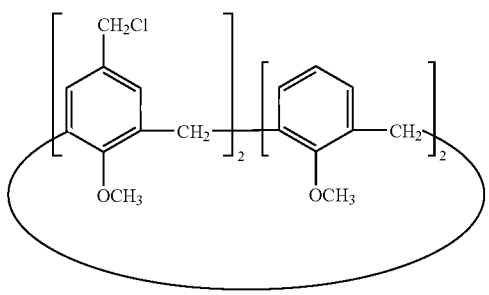

(III)

[Chemical Formula 6]

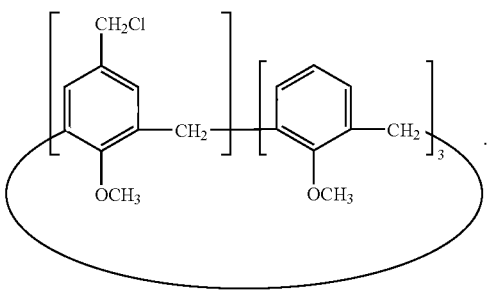

(IV)

3. The resist according to claim 2, further comprising at least one of oligomer and organic polymer compound.

4. The resist according to claim 1, further comprising at least one of oligomer and organic polymer compound.

5. The resist according to claim 1, which is exposed by the irradiation of at least one of electronic beam, X-ray, ion beam and atomic beam.

6. A method for forming a resist pattern comprising the following steps of coating the resist according to claim 1 on a substrate, exposing said resist to a radioactive ray; and a step developing said resist.

7. The method according to claim 6, wherein said radioactive ray is any of electronic beam, X-ray, ion beam and atomic beam.

8. The method according to claim 6, wherein said developing step is carried out by using a developer comprising at least one selected from the group consisting of ethyl lactate (EL), propylene glycol monomethyl ether (PGME), propylene glycol monomethyl ether acetate (PGMEA), ethyl propionate, n-butyl acetate, 2-heptanone and tetramethyl ammonium hydroxide.

9. A method for hyperfine processing comprising the steps of forming a resist pattern using the resist pattern forming method according to claim 6; and performing a processing on said substrate with said resist pattern as a mask.

\* \* \* \* \*